(12) United States Patent
Ye et al.

(10) Patent No.: US 7,740,942 B2
(45) Date of Patent: Jun. 22, 2010

(54) OPTO-ELECTRONIC DEVICES CONTAINING SULFONATED COPOLYMERS

(75) Inventors: Qing Ye, Niskayuna, NY (US); Jie Liu, Niskayuna, NY (US); Joyce Hung, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 606 days.

(21) Appl. No.: 11/610,076

(22) Filed: Dec. 13, 2006

(65) Prior Publication Data

US 2008/0145669 A1    Jun. 19, 2008

(51) Int. Cl.
B29C 39/00 (2006.01)
(52) U.S. Cl. .............. 428/419; 428/98; 428/473.5; 428/704; 428/917; 385/122
(58) Field of Classification Search .......... 428/419
See application file for complete search history.

(56) References Cited

U.S. PATENT DOCUMENTS

| 7,087,351 | B2 | 8/2006 | Aylward et al. |
| 7,455,793 | B2 * | 11/2008 | Hsu et al. ............ 252/500 |
| 2002/0076627 | A1 | 6/2002 | Coltrain et al. |
| 2004/0149572 | A1 | 8/2004 | Schlenoff et al. |
| 2004/0265603 | A1 | 12/2004 | Schlenoff |
| 2005/0031925 | A1 | 2/2005 | Ofer et al. |
| 2005/0064154 | A1 | 3/2005 | Aylward et al. |
| 2005/0124784 | A1 | 6/2005 | Sotzing |
| 2006/0068329 | A1 | 3/2006 | Aylward et al. |

FOREIGN PATENT DOCUMENTS

WO    WO2006060435 A2    6/2006

WO    WO9106887 A1    1/2008

OTHER PUBLICATIONS

PCT International Search Report dated Jan. 11, 2008.
Sezai, "Electropolymerization" Encyclopedia of Polymer Science and Technology, pp. 1-26, 2004, XP-002462732.
Hanack et al., "1,3-Bis(2-thienylmethylene)-1H,3H-thienol[3,4-c]thiophene: A Precursor for a New Low Band Gap Polymer", Chemische Berichte, vol. 126, No. 6, pp. 1487-1491, 1993, XP-002462731.
Sankir et al., "Electrically conductive polyaniline-sulfonated polyarylene ether sulfone composites", Applied Physics Letters, vol. 87, pp. 241910 (2005).
Allcock et al "Phenyl phosphonic acid functionalized poly[aryloxyphosphazenes] as proton-conducting membranes for direct methanol fuel cells" Journal of Membrane Science, vol. 201, pp. 47-54 (2002).

(Continued)

*Primary Examiner*—Harold Y Pyon
*Assistant Examiner*—Timothy Chiang
(74) *Attorney, Agent, or Firm*—Mary Louise Gioeni

(57) ABSTRACT

The invention provides an opto-electronic device comprising at least one sulfonated aromatic condensation copolymer or at least one phosphonated aromatic condensation copolymer. The at least one sulfonated aromatic condensation copolymer is selected from sulfonated polyarylethers, sulfonated polyimides, sulfonated polyphenylene oxides, sulfonated polyarylenes, sulfonated polyphosphazenes, and the at least one phosphonated aromatic condensation copolymer is selected from phosphonated polyarylethers, phosphonated polyimides, phosphonated polyphenylene oxides, phosphonated polyarylenes, phosphonated polyphosphazenes and combinations thereof. The sulfonated polyarylether is a sulfonated polyarylether block copolymer having sulfonated polyarylether ketone blocks, sulfonated polyethersulfone blocks, or combinations thereof.

20 Claims, 3 Drawing Sheets

OTHER PUBLICATIONS

Andrianov et al., "Novel Route to Sulfonated Polyphosphazenes: Single-Step Synthesis Using "Noncovalent Protection" of Sulfonic Acid Functionality" Macromolecules, vol. 37 pp. 4075-4080 (2004).

Asano et al., "Hydrolytically Stable Polyimide Ionomer for Fuel Cell Applications" Chemistry of Materials, vol. 16, No. 15, pp. 2841-2843 (2004).

Einsla et al., "Sulfonated naphthalene dianhydride based polyimide copolymers for proton-exchange-membrane fuel cells II. Membrane properties and fuel cell performance", Journal of Membrane Science, vol. 255, pp. 141-148 (2005).

Hickner et al., "Alternative Polymer Systems for Proton Exchange Membranes (PEMs)", Chemical Reviews, vol. 104, pp. 4587-4612 (2004).

Meng et al., "Proton-exchange membrane electrolytes derived from phosphonic acid containing poly(arylene ether)s", European Polymer Journal, vol. 39, pp. 627-631(2003).

Meng et al., "Synthesis and Proton Conductivities of Phosphonic Acid Containing Poly-(arylene ether)s" Journal of Polymer Science. Part A: Polymer Chemistry, vol. 39, 3218-3226 (2001).

Miyatake et al., "Proton Conductive Polyimide Electrolytes Containing Fluorenyl Groups: Synthesis, Properties, and Branching Effect", Macromolecules, vol. 37, pp. 4956-4960 (2004).

Paulsdorf et al., "Ionic conductivity in polyphosphazene polymer electrolytes prepared by the living cationic polymerization" Solid State Ionics, vol. 169, pp. 25-33 (2004).

Saito et al., "Acid-Functionalized Poly(phenylene oxide)s: Their Preparation and Properties", Industrial & Engineering Chemical Research, vol. 44, 8626-8630 (2005).

Wycisk et al., "Sulfonated polyphosphazene ion-exchange membranes", Journal of Membrane Science, vol. 199 155-160 (1996).

* cited by examiner

OPTO-ELECTRONIC DEVICES CONTAINING SULFONATED COPOLYMERS

BACKGROUND

The invention relates generally to an opto-electronic device comprising at least one sulfonated aromatic condensation copolymer or at least one phosphonated aromatic condensation copolymer.

Opto-electronic devices, such as organic light emitting devices (OLEDs), which make use of thin film materials that emit light when subjected to a voltage bias, are expected to become an increasingly popular form of flat panel display technology. This is because OLEDs have a wide variety of potential applications, including cell phones, personal digital assistants (PDAs), computer displays, informational displays in vehicles, television monitors, as well as light sources for general illumination. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs). Due to their high luminous efficiencies, OLEDs are seen as having the potential to replace incandescent, and perhaps even fluorescent, lamps for certain types of applications.

State-of-the-art OLEDs are built on a transparent anode, typically indium tin oxide (ITO). The ITO is a degenerated n-type semiconductor with a work function in the range of 4.4 to 4.8 eV. However, for most organic emissive materials (OEMs) such as light-emitting polymers (LEPs), the highest occupied molecular orbital (HOMO) lies more than 5 eV below vacuum. A significant energy barrier for hole injection is thus expected at the ITO/OEM interface, resulting in inefficient hole injection and subsequently poor overall device performance such as poor quantum efficiency and high driving voltages. Notwithstanding the current efforts to circumvent this problem of inefficient hole injection, there exists a need in the art to develop a single-component and, more preferred, organic solvent-based, hole-injection material.

BRIEF DESCRIPTION

In one aspect, the present invention relates to an opto-electronic device comprising at least one sulfonated aromatic condensation copolymer or at least one phosphonated aromatic condensation copolymer.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
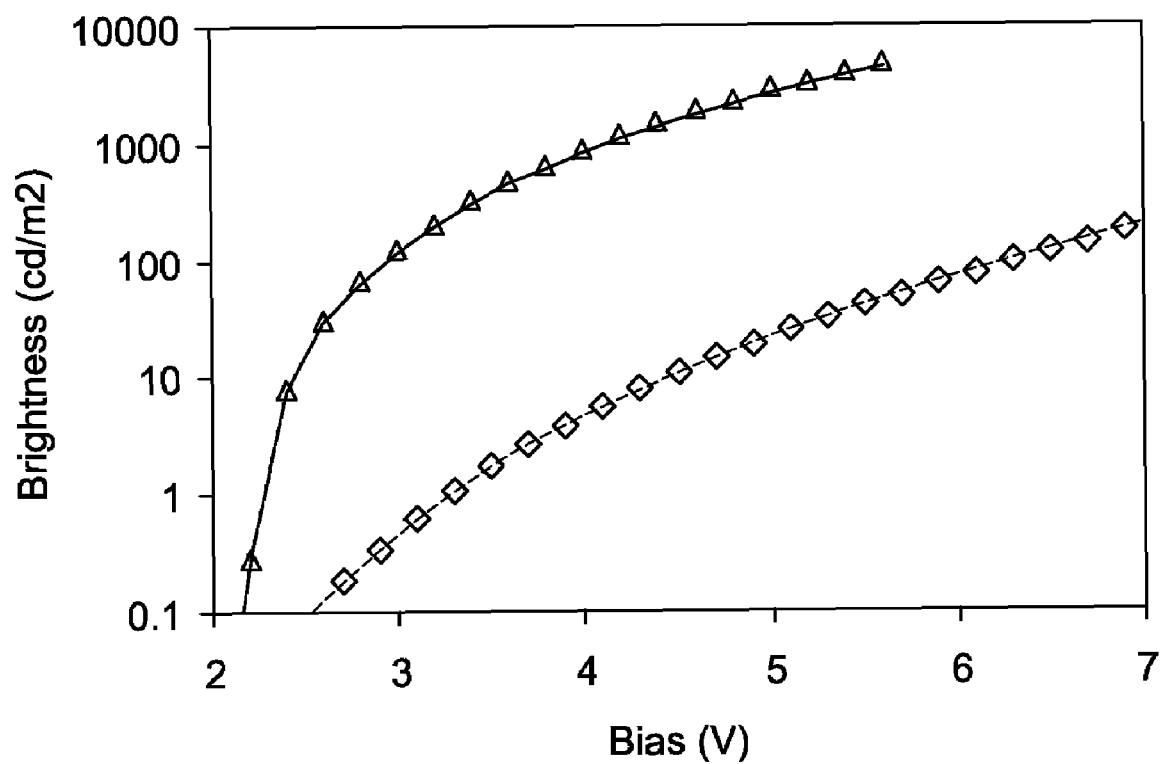
FIG. 1 shows the brightness versus bias voltage curves for the control OLED (diamonds) and the exemplary OLED (triangles).

Opto-electronic devices are electrical-to-optical or optical-to-electrical transducers, or instruments that use such devices in their operation. Exemplary opto-electronic devices include, but are not limited to, light emitting diodes, optical fibers, and photovoltaic cells.

A condensation reaction or polymerization is a chemical reaction in which two molecules or moieties react and become covalently bonded to one another by the concurrent loss of a small molecule. A condensation copolymer typically results from the reaction of at least two difunctional monomers, although one or more self-reacting monomers containing two different functional groups, such as 4-fluoro-4'-hydroxydiphenylsulfone, may also be used. Condensation polymerizations are distinguished from other polymerization processes such as anionic, cationic, free radical polymerization.

Sulfonated aromatic condensation copolymers, as used herein, refers to a copolymer wherein at least a few or all of the repeat units comprise a $SO_3M$ group, wherein M is H, a metal cation, a non-metallic inorganic cation, an organic cation or a mixture thereof. Phosphonated aromatic condensation copolymers, as used herein, refers to a copolymer wherein at least a few or all of the repeat units comprise a $PO_3M$ group, wherein M is H, a metal cation, a non-metallic inorganic cation, an organic cation or a mixture thereof. In many embodiments, particularly where the copolymer is used in a hole injection layer or hole collection layer of an opto-electronic device, it may be desirable to utilize the acid form of the sulfonate or phosphonate groups in the polymer, in order to provide mobile protons. In this case, M is H or a mixture of H and one or more of the cations listed above, and in some embodiments, it may be preferred that M is H.

The sulfonated aromatic condensation copolymers include sulfonated polyarylethers, sulfonated polyimides, sulfonated polyphenylene oxides, sulfonated polyarylenes, sulfonated polyphosphazenes and the like.

In another aspect, the phosphonated aromatic condensation copolymers include, but not limited to, phosphonated polyarylethers, phosphonated polyimides, phosphonated polyphenylene oxides, phosphonated polyarylenes, phosphonated polyphosphazenes and the like.

Polyarylethers comprise aromatic ether structural units as part of the main chain repeat unit. Polyarylethers are synthesized by the condensation of an aromatic dihydroxy compound with a dihalide. Polyarylethers may also comprise other functional groups such as ketones, sulfones, esters, and the like. For example, when the polyarylethers further comprise an imide functional group, the polymer may also be known in the art as polyetherimide, or polyaryletherimide. Copolymers having other functional groups may be synthesized by the appropriate choice of monomers already comprising the necessary functional groups. Without being bound to any theory, it is to be understood that various functional groups impart different properties to the copolymer useful for a variety of applications.

Polyimides comprise aromatic imide structural units as part of the main chain repeat unit. Polyimides may be synthesized by the reaction of an aromatic dianhydride with a diamine. As in the case of the polyarylethers, polyimides may further comprise other functional group repeat units such as, ether, sulfone, ketone, and the like.

Polyphenylene oxides comprise phenyl ether structural units as part of main chain repeat units, and maybe synthesized by the oxidative coupling of a phenol in the presence of a metal catalyst, such as copper.

Polyarylenes comprise structural units of aromatic groups linked to another aromatic group. Polyarylenes may be synthesized by a variety of methods known in the art, such as the Suzuki coupling methodology.

Polyphosphazenes comprise structural units having phosphorus-nitrogen linkage as part of the main chain, wherein both the phosphorus and the nitrogen are substituted with organic groups. Polyphosphazenes may be synthesized by many methods known in the art, and are also commercially available.

In some embodiments, the sulfonated aromatic condensation copolymer is a sulfonated polyarylether block copolymer. In one embodiment, the polyarylether block copolymer comprises at least one sulfonated polyaryletherketone block having structural units of formula I

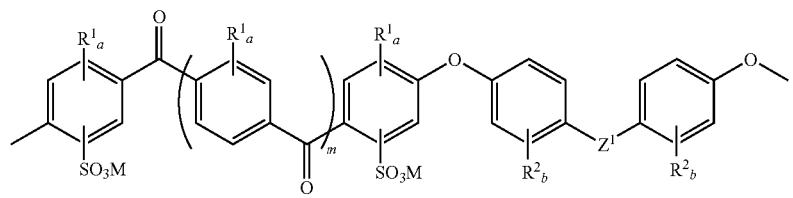

wherein $R^1$ and $R^2$ are independently $C_1$-$C_{10}$ alkyl, $C_3$-$C_{12}$ cycloalkyl, $C_6$-$C_{14}$ aryl, allyl, alkenyl, alkoxy, halo, or cyano;

$Z^1$ is a direct bond, O, S, $CH_2$, SO, $SO_2$, CO, phosphinyl oxide, alkenyl, alkynyl, a $C_1$-$C_{12}$ aliphatic radical, a $C_3$-$C_{12}$ cycloaliphatic radical, a $C_3$-$C_{12}$ aromatic radical or a combination thereof;

M is H, a metal cation, a non-metallic inorganic cation, an organic cation or a mixture thereof;

a is 0 or an integer from 1 to 3;

b is 0 or an integer from 1 to 4;

m is 0 or 1.

The sulfonated aromatic condensation copolymers are typically prepared by polycondensation of sulfonated or unsulfonated dihydroxyaryl monomers with sulfonated or unsulfonated dihaloaryl comonomers. The units of formula I may be derived from one or more substituted or unsubstituted dihalobenzophenones such as 4,4'-difluorobenzophenone or 4,4'-dichlorobenzophenone, or from a di(halobenzoyl)benzene such as 1,4-bis(4-fluorobenzoyl)benzene or 1,4-bis(4-chlorobenzoyl)benzene. In a particular embodiment, a and m are 0, and the units of formula I are derived from an unsubstituted dihalobenzophenone. Sulfonated dihalodiarylketone monomers, particularly sulfonated dihalobenzophenone monomers, may be used to prepare the sulfonated aromatic condensation copolymers, although the sulfonated aromatic condensation copolymers may be prepared by post-sulfonation if desired. Post-sulfonation means direct sulfonation of a non-sulfonated aromatic condensation copolymer, using a sulfonating reagent such as $SO_3$, $ClSO_3H$, $Me_3SiSO_3Cl$, or fuming or concentrated $H_2SO_4$. The use of sulfonated monomers may allow greater control of polymer architecture. Examples of suitable sulfonated dihalobenzophenone monomers include 4,4'-difluoro-3,3'-disulfonated-benzophenone sodium and potassium salts; 4,4'-dichloro-3,3'-disulfonated-benzophenone sodium and potassium salts; and 4,4'-difluorobenzophenone-3,3'-bis(sulfonic acid) and 4,4'-dichlorobenzophenone-3,3'-bis(sulfonic acid).

Exemplary aromatic dihydroxy compounds include, but are not limited to, 4,4'-dihydroxyphenyl sulfone, 2,4'-dihydroxyphenyl sulfone, 4,4'-dihydroxyphenyl sulfoxide, 2,4'-dihydroxyphenyl sulfoxide, bis(3,5-dimethyl-4-hydroxyphenyl)sulfoxide, bis(3,5-dimethyl-4-hydroxyphenyl)sulfone, 4,4-(phenylphosphinyl)diphenol, 4,4'-(3,3,5-trimethylcyclohexylidene)diphenol, 4,4'-bis(3,5-dimethyl)diphenol, 1,1-bis(4-hydroxy-3-methylphenyl)cyclohexane, 4,4-bis(4-hydroxyphenyl)heptane, 2,4'-dihydroxydiphenylmethane, bis(2-hydroxyphenyl)methane, bis(4-hydroxyphenyl)methane, bis(4-hydroxy-5-nitrophenyl)methane, bis(4-hydroxy-2,6-dimethyl-3-methoxyphenyl)methane, 1,1-bis(4-hydroxyphenyl)ethane, 1,1-bis(4-hydroxy-2-chlorophenyl)ethane, 2,2-bis(4-hydroxyphenyl)propane, 2,2-bis(3-phenyl-4-hydroxyphenyl)propane, 2,2-bis(4-hydroxy-3-methylphenyl)propane, 2,2-bis(4-hydroxy-3-ethylphenyl)propane, 2,2-bis(4-hydroxy-3-isopropylphenyl)propane, 2,2-bis(4-hydroxy-3,5-dimethylphenyl)propane, 2,2-bis(3,5,3',5'-tetrachloro-4,4'-dihydroxyphenyl)propane, bis(4-hydroxyphenyl)cyclohexylmethane, 2,2-bis(4-hydroxyphenyl)-1-phenylpropane, 3-(4-hydroxyphenyl)-1,1,3-trimethylindan-5-ol, 2-(4-hydroxyphenyl)-1,3,3-trimethylindan-5-ol, 2,2,2',2'-tetrahydro-3,3,3',3'-tetramethyl-1,1'-spirobi[1H-indene]-6,6'-diol, 1-methyl-1,3-bis(4-hydroxyphenyl)-3-isopropylcyclohexane, 1-methyl-2-(4-hydroxyphenyl)-3-[1-(4-hydroxyphenyl)isopropyl]cyclohexane, bis(4-hydroxyphenyl)sulfide, bis(4-hydroxyphenyl)ether, 4,4'-oxydiphenol, 2,2-bis(4-hydroxyphenyl)hexafluoropropane, 1,2-bis(4-hydroxyphenyl)ethane, 2,2-bis(4-hydroxyphenyl)butane, 2,2-bis(4-hydroxyphenyl)-2-methylbutane, 1,1-bis(4-hydroxyphenyl)cyclohexane, 2-(3-methyl-4-hydroxyphenyl-2-(4-hydroxyphenyl)propane, 2-(3,5-dimethyl-4-hydroxyphenyl)-2-(4-hydroxyphenyl)propane, 2-(3-methyl-4-hydroxyphenyl)-2-(3,5-dimethyl-4-hydroxyphenyl) propane, bis(3,5-dimethylphenyl-4-hydroxyphenyl) methane, 1,1-bis(3,5-dimethylphenyl-4-hydroxyphenyl) ethane, 2,2-bis(3,5-dimethylphenyl-4-hydroxyphenyl) propane, 2,4-bis(3,5-dimethylphenyl-4-hydroxyphenyl)-2-methylbutane, 3,3-bis(3,5-dimethylphenyl-4-hydroxyphenyl)pentane, 1,1-bis(3,5-dimethylphenyl-4-hydroxyphenyl)cyclopentane, 1,1-bis(3,5-dimethylphenyl-4-hydroxyphenyl)cyclohexane, bis(3,5-dimethylphenyl-4-hydroxyphenyl)sulfide, and combinations thereof. Polymer may additionally include residues from other aromatic dihydroxy monomers that include, but are not limited to, 2-diphenylphosphinylhydroquinone, 2,6-dihydroxy naphthalene, hydroquinone, resorcinol, $C_{1-3}$ alkyl-substituted resorcinols, and combinations thereof.

The sulfonated aromatic dihalide may be synthesized by the sulfonation of the corresponding aromatic dihalide using a suitable sulfonating agent such as, but not limited to, chlorosulfonic acid, sulfuric acid, and the like.

In a specific embodiment, a, b, and m in formula I are 0, and the sulfonated polyaryletherketone block comprises structural units of formula IA

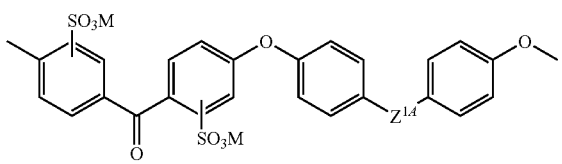

wherein $Z^{1A}$ is a direct bond, $C(CF_3)_2$ or a combination thereof.

The sulfonated polyarylether block copolymer additionally comprises at least one unsulfonated polyarylethersulfone block having structural units of formula II

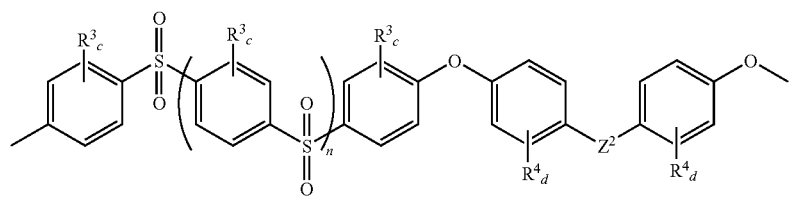

wherein $Z^{2A}$ is a direct bond, $C(CF_3)_2$ or a combination thereof.

The synthesis of unsulfonated polyarylethersulfone block of the sulfonated polyaryletherketone block copolymer is achieved by the same method as described for the synthesis of the sulfonated polyaryletherketone block, using the appropriate monomers.

In another embodiment, the sulfonated polyarylether block copolymer comprises at least one sulfonated polyethersulfone block having structural units of formula III

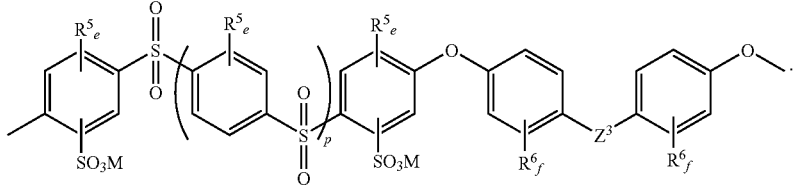

wherein $R^3$ and $R^4$ are independently $C_1$-$C_{10}$ alkyl, $C_3$-$C_{12}$ cycloalkyl, $C_6$-$C_{14}$ aryl, allyl, alkenyl, alkoxy, halo, or cyano;

$Z^2$ is a direct bond, O, S, $CH_2$, SO, $SO_2$, CO, phosphinyl oxide, alkenyl, alkynyl, a $C_1$-$C_{12}$ aliphatic radical, a $C_3$-$C_{12}$ cycloaliphatic radical, a $C_3$-$C_{12}$ aromatic radical or a combination thereof;

M is H, a metal cation, a non-metallic inorganic cation, an organic cation or a mixture thereof;

c is 0 or an integer from 1 to 3;

d is 0 or an integer from 1 to 4;

n is 0 or 1.

In a specific embodiment, c, d, and n in formula II are 0, and the unsulfonated polyarylethersulfone block comprises structural units of formula IIA

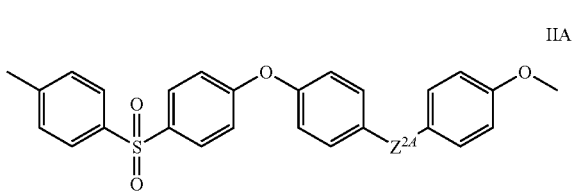

wherein $R^5$ is $C_1$-$C_{10}$ alkyl, $C_3$-$C_{12}$ cycloalkyl, $C_6$-$C_{14}$ aryl, allyl, alkenyl, alkoxy, halo, or cyano;

$Z^3$ is a direct bond, O, S, $CH_2$, SO, $SO_2$, CO, phosphinyl oxide, alkenyl, alkynyl, a $C_1$-$C_{12}$ aliphatic radical, a $C_3$-$C_{12}$ cycloaliphatic radical, a $C_3$-$C_{12}$ aromatic radical or a combination thereof;

M is H, a metal cation, a non-metallic inorganic cation, an organic cation or a mixture thereof;

e is 0 or an integer from 1 to 3;

f is 0 or an integer from 1 to 4; and p is 0 or 1.

In some specific embodiments, e, f, and p in formula III are 0, thus the sulfonated polyarylethersulfone has formula IIIA

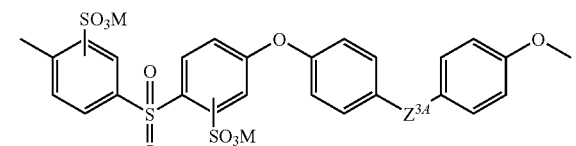

wherein $Z^{3A}$ is a direct bond, $C(CF_3)_2$ or a combination thereof. In one specific embodiment, $Z^{3A}$ is $C(CF_3)_2$.

The sulfonated polyaryletherketone block in the sulfonated polyarylether block copolymer may be present in an amount ranging from about 5 mole percent (mol %) to about 50 mol % in one embodiment, and from about 25 mol % to about 50 mol % in another embodiment. Mol %, as used herein, refers to the amount of the moles with respect to the total number of moles of the aromatic dihalide monomer that result in the polymer. Mole % may be determined by various techniques known in the art, and may include, but not limited to, NMR, titration, and the like. The percent sulfonation in the sulfonated polyarylether block copolymer ranges from about 10 mole % to about 70 mole % in one embodiment, and from about 10 mole % to about 35 mole % in another embodiment. Thus, in one embodiment, the sulfonated polyarylether block copolymer comprises unsulfonated polyaryletherketone blocks in an amount ranging from about 10 mole % to about 50 mole %. Correspondingly, in one embodiment, the sulfonated aromatic condensation copolymer comprises at least about 30 mole % sulfonation that results from the sulfonated monomers being incorporated into the polymer, and in another embodiment, the sulfonated aromatic condensation copolymer comprises at least about 50 mole % sulfonation.

In another aspect, the present invention relates to optoelectronic devices containing phosphonated aromatic condensation copolymers. In some embodiments, the phosphonated aromatic condensation copolymer is a phosphonated polyarylether block copolymer. In one embodiment, the polyarylether block copolymer comprises at least one phosphonated polyaryletherketone blocks having structural units of formula IV

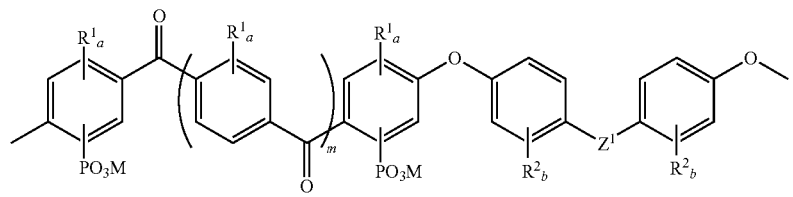

IV wherein $R^1$ and $R^2$ are independently $C_1$-$C_{10}$ alkyl, $C_3$-$C_{12}$ cycloalkyl, $C_6$-$C_{14}$ aryl, allyl, alkenyl, alkoxy, halo, or cyano;

$Z^1$ is a direct bond, O, S, $CH_2$, SO, $SO_2$, CO, phospinyl oxide, alkenyl, alkynyl, a $C_1$-$C_{12}$ aliphatic radical, a $C_3$-$C_{12}$ cycloaliphatic radical, a $C_3$-$C_{12}$ aromatic radical or a combination thereof;

M is H, a metal cation, a non-metallic inorganic cation, an organic cation or a mixture thereof;

a is 0 or an integer from 1 to 3;

b is 0 or an integer from 1 to 4;

m is 0 or 1.

Phosphonated aromatic condensation copolymers are typically prepared by post-phosphonation of a brominated aromatic polymer, using a metal catalyst (such as Ni or Pd) to couple the brominated organic moieties with diethyl phosphite, forming covalent P—C bonds (Arbuzov reaction). The phosphonate ester groups on the polymer backbone are then hydrolyzed to the phosphonic acid form. Post-phosphonation may also be achieved by treatment of brominated aromatic polymers with n-butyllithium, followed by reaction with diphenyl phosphorylchloride, and then hydrolysis. The use of phosphonated monomers typically allows greater control of polymer architecture. Examples of suitable phosphonated dihydroxyaryl and dihalodiaryl monomers include 4,4'-dihydroxy-3,3'-diphosphonated-biphenol, 4,4'-dihydroxy-3,3'-diphosphonated-sulfonyldiphenol, and 4,4'-dihydroxy-3,3'-diphosphonated-benzophenone.

An alkali metal compound may be used to effect the reaction between the sulfonated or phosphonated aromatic dihalides and aromatic dihydroxy compounds, and is not particularly limited so far as it can convert the aromatic dihydroxy compound to the corresponding alkali metal salt. Exemplary compounds include alkali metal carbonates, such as, but not limited to, lithium carbonate, sodium carbonate, potassium carbonate, rubidium carbonate, and cesium carbonate; alkali metal hydrogen carbonates, such as but not limited to lithium hydrogen carbonate, sodium hydrogen carbonate, potassium hydrogen carbonate, rubidium hydrogen carbonate, and cesium hydrogen carbonate; and alkali metal hydroxides, such as but not limited to lithium hydroxide, sodium hydroxide, potassium hydroxide, rubidium hydroxide, and cesium hydroxide. Combinations of compounds may also be used to effect the reaction.

Some examples of the aprotic polar solvent that may be effectively used to make the sulfonated polyarylethers include N,N-dimethylformamide, N,N-diethylformamide, N,N-dimethylacetamide, N,N-diethylacetamide, N,N-dipropylacetamide, N,N-dimethylbenzamide, N-methyl-2-pyrrolidone (NMP), N-ethyl-2-pyrrolidone, N-isopropyl-2-pyrrolidone, N-isobutyl-2-pyrrolidone, N-n-propyl-2-pyrrolidone, N-n-butyl-2-pyrrolidone, N-cyclohexyl-2-pyrrolidone, N-methyl-3-methyl-2-pyrrolidone, N-ethyl-3-methyl-pyrrolidone, N-methyl-3,4,5-trimethyl-2-pyrrolidone, N-methyl-2-piperidone, N-ethyl-2-piperidone, N-isopropyl-2-piperidone, N-methyl-6-methyl-2-piperidone, N-methyl-3-ethylpiperidone, dimethylsulfoxide, diethylsulfoxide, sulfolane, 1-methyl-1-oxosulfolane, 1-ethyl-1-oxosulfolane, 1-phenyl-1-oxosulfolane, N,N'-dimethylimidazolidinone (DMI), diphenylsulfone, and combinations thereof.

When halogenated aromatic solvents are used, a phase transfer catalyst may be used. Suitable phase transfer catalysts include hexaalkylguanidinium salts and bis-guanidinium salts. Typically the phase transfer catalyst comprises an anionic species such as halide, mesylate, tosylate, tetrafluoroborate, or acetate as the charge-balancing counterion(s). Suitable guanidinium salts include those disclosed in U.S. Pat. No. 5,132,423; U.S. Pat. No. 5,116,975 and U.S. Pat. No. 5,081,298. Other suitable phase transfer catalysts include p-dialkylamino-pyridinium salts, bis-dialkylaminopyridinium salts, bis-quaternary ammonium salts, bis-quaternary phosphonium salts, and phosphazenium salts. Suitable bis-quaternary ammonium and phosphonium salts are disclosed in U.S. Pat. No. 4,554,357. Suitable aminopyridinium salts are disclosed in U.S. Pat. No. 4,460,778; U.S. Pat. No. 4,513,141 and U.S. Pat. No. 4,681,949. Suitable phosphazenium salts are disclosed in U.S. patent application Ser. No. 10/950,874. Additionally, in certain embodiments, the quaternary ammonium and phosphonium salts disclosed in U.S. Pat. No. 4,273,712 may also be used.

The reaction may be conducted at a temperature ranging from about 150° C. to about 250° C. The reaction is often conducted in the presence of a solvent that forms an azeotrope with water to facilitate the removal of water, which is the byproduct formed in the reaction. The reaction is typically conducted for a time period ranging from about 1 hour to about 72 hours.

After completing the reaction, the polymer may be precipitated out of a nonsolvent and collected and purified by filtration and drying optionally under vacuum and at high temperature, as is known commonly in the art.

The sulfonated or phosphonated polyarylethers may be characterized by number average molecular weight ($M_n$) and weight average molecular weight ($M_w$). The various average molecular weights $M_n$ and $M_w$ are determined by techniques such as gel permeation chromatography, and is known generally to those of ordinary skill in the art. In one embodiment, the $M_n$ of the polymer may be in the range from about 20,000 grams per mole (g/mol) to about 1,000,000 g/mol. In another embodiment, the $M_n$ ranges from about 20,000 g/mol to about 200,000 g/mol. In yet another embodiment, the $M_n$ ranges from about 20,000 g/mol to about 50,000 g/mol.

The sulfonated or phosphonated polymers are useful in the preparation of opto-electronic devices, for example organic light emitting diodes (OLEDs). Other opto-electronic devices in which the sulfonated or phosphonated polymers of the present invention may be used include light emitting electrochemical cells, photo detectors, photoconductive cells, photo switches, phototransistors, and phototubes. Thus, in one embodiment, the present invention relates to opto-electronic devices comprising a sulfonated or phosphonated polymer. In another embodiment, the present invention relates to opto-electronic devices comprising a blend of sulfonated or phosphonated polymers with another polymer. Suitable polymers for this purpose include emissive polymers, particularly poly (3,4-ethylenedioxythiophene) (PEDOT). The blends typically contain the sulfonated or phosphonated aromatic condensation copolymers amounts ranging from about 20 weight percent (wt %) to about 80 wt %, particularly from about 30 weight percent (wt %) to about 70 wt %, and more particularly, from about 40 weight percent (wt %) to about 600 wt %. In a specific embodiment, the blend is composed of about 50% PEDOT and about 50% sulfonated or phosphonated aromatic condensation copolymer.

An opto-electronic device, exemplified by an organic light emitting device, typically comprises multiple layers which include in the simplest case, an anode layer and a corresponding cathode layer with an organic electroluminescent layer disposed between said anode and said cathode. When a voltage bias is applied across the electrodes, electrons are injected by the cathode into the electroluminescent layer while electrons are removed from (or "holes" are "injected" into) the electroluminescent layer from the anode. Light emission occurs as holes combine with electrons within the electroluminescent layer to form singlet or triplet excitons, light emission occurring as singlet excitons transfer energy to the environment by radiative decay.

Other components which may be present in an organic light emitting device in addition to the anode, cathode and light emitting material include hole injection layers, electron injection layers, and electron transport layers. The electron transport layer need not be in contact with the cathode, and frequently the electron transport layer is not an efficient hole transporter and thus it serves to block holes migrating toward the cathode. During operation of an organic light emitting device comprising an electron transport layer, the majority of charge carriers (i.e. holes and electrons) present in the electron transport layer are electrons and light emission can occur through recombination of holes and electrons present in the electron transport layer. Additional components which may be present in an organic light emitting device include hole transport layers, hole transporting emission (emitting) layers and electron transporting emission (emitting) layers.

The organic electroluminescent layer is a layer within an organic light emitting device which when in operation contains a significant concentration of both electrons and holes and provides sites for exciton formation and light emission. A hole injection layer is a layer in contact with the anode which promotes the injection of holes from the anode into the interior layers of the OLED; and an electron injection layer is a layer in contact with the cathode that promotes the injection of electrons from the cathode into the OLED; an electron transport layer is a layer which facilitates conduction of electrons from cathode to a charge recombination site. The electron transport layer need not be in contact with the cathode, and frequently the electron transport layer is not an efficient hole transporter and thus it serves to block holes migrating toward the cathode. During operation of an organic light emitting device comprising an electron transport layer, the majority of charge carriers (i.e. holes and electrons) present in the electron transport layer are electrons and light emission can occur through recombination of holes and electrons present in the electron transport layer. A hole transport layer is a layer which when the OLED is in operation facilitates conduction of holes from the anode to charge recombination sites and which need not be in contact with the anode. A hole transporting emission layer is a layer in which when the OLED is in operation facilitates the conduction of holes to charge recombination sites, and in which the majority of charge carriers are holes, and in which emission occurs not only through recombination with residual electrons, but also through the transfer of energy from a charge recombination zone elsewhere in the device. A electron transporting emission layer is a layer in which when the OLED is in operation facilitates the conduction of electrons to charge recombination sites, and in which the majority of charge carriers are electrons, and in which emission occurs not only through recombination with residual holes, but also through the transfer of energy from a charge recombination zone elsewhere in the device.

Materials suitable for use as the anode include materials having a bulk conductivity of at least about 100 ohms per square, as measured by a four-point probe technique. Indium tin oxide (ITO) is frequently used as the anode because it is substantially transparent to light transmission and thus facilitates the escape of light emitted from electro-active organic layer. Other materials which may be utilized as the anode layer include tin oxide, indium oxide, zinc oxide, indium zinc oxide, zinc indium tin oxide, antimony oxide, and mixtures thereof.

Materials suitable for use as the cathode include by zero valent metals which can inject negative charge carriers (electrons) into the inner layer(s) of the OLED. Various zero valent metals suitable for use as the cathode include K, Li, Na, Cs, Mg, Ca, Sr, Ba, Al, Ag, Au, In, Sn, Zn, Zr, Sc, Y, elements of the lanthanide series, alloys thereof, and mixtures thereof. Suitable alloy materials for use as the cathode layer include Ag—Mg, Al—Li, In—Mg, Al—Ca, and Al—Au alloys. Layered non-alloy structures may also be employed in the cathode, such as a thin layer of a metal such as calcium, or a metal fluoride, such as LiF, covered by a thicker layer of a zero valent metal, such as aluminum or silver. In particular, the cathode may be composed of a single zero valent metal, and especially of aluminum metal.

Opto-electronic devices according to the present invention include sulfonated and or phosphonated polymers in the hole injection layer. The sulfonated or phosphonated polymers may be used in place of, or in addition to, traditional materials such as poly(3,4-ethylenedioxythiophene), which is commercially available from H.C. Stark, Inc. under the BAYTRON® tradename, and polymers based on the thieno[3,4b]thiophene (TT) monomer, commercially available from Air Products Corporation. In particular, the sulfonated or phosphonated polymers may be blended with PEDOT to form a hole injection layer.

Materials suitable for use in hole transporting layers include 1,1-bis((di-4-tolylamino)phenyl)cyclohexane, N,N'-bis(4-methylphenyl)-N,N'-bis(4-ethylphenyl)-(1,1'-(3,3'-dimethyl)biphenyl)-4,4'-diamine, tetrakis-(3-methylphenyl)-N,N,N',N'-2,5-phenylenediamine, phenyl-4-N,N-diphenylaminostyrene, p-(diethylamino)benzaldehyde diphenylhydrazone, triphenylamine, 1-phenyl-3-(p-(diethylamino)styryl)-5-(p-(diethylamino)phenyl)pyrazoline, 1,2-trans-bis(9H-carbazol-9-yl)cyclobutane, N,N,N',N'-tetrakis (4-methylphenyl)-(1,1'-biphenyl)-4,4'-diamine, copper phthalocyanine, polyvinylcarbazole, (phenylmethyl)polysilane; poly(3,4-ethylendioxythiophene) (PEDOT), polyaniline, polyvinylcarbazole, triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

Materials suitable for use as the electron transport layer include poly(9,9-dioctyl fluorene), tris(8-hydroxyquinolato) aluminum ($Alq_3$), 2,9-dimethyl-4,7-diphenyl-1,1-phenanthroline, 4,7-diphenyl-1,10-phenanthroline, 2-(4-biphenylyl)-5-(4-t-butylphenyl)-1,3,4-oxadiazole, 3-(4-biphenylyl)-4-phenyl-5-(4-t-butylphenyl)-1,2,4-triazole, 1,3,4-oxadiazole-containing polymers, 1,3,4-triazole-containing polymers, quinoxaline-containing polymers, and cyano-PPV.

Materials suitable for use in the light emitting layer include electroluminescent polymers such as poly(9,9-dioctyl fluorene) and copolymers thereof, such as F8-TFB.

In one aspect, sulfonated aromatic condensation copolymers and/or phosphonated aromatic condensation copolymers may form part of the hole collection layer, while in another aspect, sulfonated aromatic condensation copolymers and/or phosphonated aromatic condensation copolymer form part of the hole injection layer. Thus, in one aspect, the present invention provides more efficient organic light emitting devices comprising at least one of the sulfonated aromatic condensation copolymers and/or phosphonated aromatic condensation copolymer.

DEFINITIONS

As used herein, the term "aromatic radical" refers to an array of atoms having a valence of at least one comprising at least one aromatic group. The array of atoms having a valence of at least one comprising at least one aromatic group may include heteroatoms such as nitrogen, sulfur, selenium, silicon and oxygen, or may be composed exclusively of carbon and hydrogen. As used herein, the term "aromatic radical" includes but is not limited to phenyl, pyridyl, furanyl, thienyl, naphthyl, phenylene, and biphenyl radicals. As noted, the aromatic radical contains at least one aromatic group. The aromatic group is invariably a cyclic structure having 4n+2 "delocalized" electrons where "n" is an integer equal to 1 or greater, as illustrated by phenyl groups (n=1), thienyl groups (n=1), furanyl groups (n=1), naphthyl groups (n=2), azulenyl groups (n=2), anthracenyl groups (n=3) and the like. The aromatic radical may also include nonaromatic components. For example, a benzyl group is an aromatic radical which comprises a phenyl ring (the aromatic group) and a methylene group (the nonaromatic component). Similarly a tetrahydronaphthyl radical is an aromatic radical comprising an aromatic group ($C_6H_3$) fused to a nonaromatic component —$(CH_2)_4$—. For convenience, the term "aromatic radical" is defined herein to encompass a wide range of functional groups such as alkyl groups, alkenyl groups, alkynyl groups, haloalkyl groups, haloaromatic groups, conjugated dienyl groups, alcohol groups, ether groups, aldehydes groups, ketone groups, carboxylic acid groups, acyl groups (for example carboxylic acid derivatives such as esters and amides), amine groups, nitro groups, and the like. For example, the 4-methylphenyl radical is a $C_7$ aromatic radical comprising a methyl group, the methyl group being a functional group which is an alkyl group. Similarly, the 2-nitrophenyl group is a $C_6$ aromatic radical comprising a nitro group, the nitro group being a functional group. Aromatic radicals include halogenated aromatic radicals such as 4-trifluoromethylphenyl, hexafluoroisopropylidenebis(4-phen-1-yloxy) (i.e., —OPhC($CF_3$)$_2$PhO—), 4-chloromethylphen-1-yl, 3-trifluorovinyl-2-thienyl, 3-trichloromethylphen-1-yl (i.e., 3-$CCl_3$Ph-), 4-(3-bromoprop-1-yl)phen-1-yl (i.e., 4-BrCH$_2$CH$_2$CH$_2$Ph-), and the like. Further examples of aromatic radicals include 4-allyloxyphen-1-oxy, 4-aminophen-1-yl (i.e., 4-H$_2$NPh-), 3-aminocarbonylphen-1-yl (i.e., NH$_2$COPh-), 4-benzoylphen-1-yl, dicyanomethylidenebis (4-phen-1-yloxy) (i.e., —OPhC(CN)$_2$PhO—), 3-methylphen-1-yl, methylenebis(4-phen-1-yloxy) (i.e., —OPhCH$_2$PhO—), 2-ethylphen-1-yl, phenylethenyl, 3-formyl-2-thienyl, 2-hexyl-5-furanyl, hexamethylene-1,6-bis(4-phen-1-yloxy) (i.e., —OPh(CH$_2$)$_6$PhO—), 4-hydroxymethylphen-1-yl (i.e., 4-HOCH$_2$Ph-), 4-mercaptomethylphen-1-yl (i.e., 4-HSCH$_2$Ph-), 4-methylthiophen-1-yl (i.e., 4-CH$_3$SPh-), 3-methoxyphen-1-yl, 2-methoxycarbonylphen-1-yloxy (e.g. methyl salicyl), 2-nitromethylphen-1-yl (i.e., 2-NO$_2$CH$_2$Ph), 3-trimethylsilylphen-1-yl, 4-t-butyldimethylsilylphenl-1-yl, 4-vinylphen-1-yl, vinylidenebis (phenyl), and the like. The term "a $C_3$-$C_{10}$ aromatic radical" includes aromatic radicals containing at least three but no more than 10 carbon atoms. The aromatic radical 1-imidazolyl ($C_3H_2N_2$—) represents a $C_3$ aromatic radical. The benzyl radical ($C_7H_7$—) represents a $C_7$ aromatic radical.

As used herein the term "cycloaliphatic radical" refers to a radical having a valence of at least one, and comprising an array of atoms which is cyclic but which is not aromatic. As defined herein a "cycloaliphatic radical" does not contain an aromatic group. A "cycloaliphatic radical" may comprise one or more noncyclic components. For example, a cyclohexylmethyl group ($C_6H_{11}CH_2$—) is an cycloaliphatic radical which comprises a cyclohexyl ring (the array of atoms which is cyclic but which is not aromatic) and a methylene group (the noncyclic component). The cycloaliphatic radical may include heteroatoms such as nitrogen, sulfur, selenium, silicon and oxygen, or may be composed exclusively of carbon and hydrogen. For convenience, the term "cycloaliphatic radical" is defined herein to encompass a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylcyclopent-1-yl radical is a $C_6$ cycloaliphatic radical comprising a methyl group, the methyl group being a functional group which is an alkyl group. Similarly, the 2-nitrocyclobut-1-yl radical is a $C_4$ cycloaliphatic radical comprising a nitro group, the nitro group being a functional group. A cycloaliphatic radical may comprise one or more halogen atoms which may be the same or different. Halogen atoms include, for example; fluorine, chlorine, bromine, and iodine. Cycloaliphatic radicals comprising one or more halogen atoms include 2-trifluoromethylcyclohex-1-yl, 4-bromodifluoromethylcyclooct-1-yl, 2-chlorodifluoromethylcyclohex-1-yl, hexafluoroisopropylidene-2,2-bis(cyclohex-4-yl) (i.e., —$C_6H_{10}$C($CF_3$)$_2$ $C_6H_{10}$—), 2-chloromethylcyclohex-1-yl, 3-difluoromethylenecyclohex-1-yl, 4-trichloromethylcyclohex-1-yloxy, 4-bromodichloromethylcyclohex-1-ylthio, 2-bromoethylcyclopent-1-yl, 2-bromopropylcyclohex-1-yloxy (e.g. $CH_3CHBrCH_2C_6H_{10}O$—), and the like. Further examples of cycloaliphatic radicals include 4-allyloxycyclohex-1-yl, 4-aminocyclohex-1-yl (i.e., $H_2C_6H_{10}$—), 4-aminocarbonylcyclopent-1-yl (i.e., $NH_2COC_5H_8$—), 4-acetyloxycyclohex-1-yl, 2,2-dicyanoisopropylidenebis(cyclohex-4-yloxy) (i.e., —$OC_6H_{10}C(CN)_2C_6H_{10}O$—), 3-methylcyclohex-1-yl, methylenebis(cyclohex-4-yloxy) (i.e., —$OC_6H_{10}CH_2C_6H_{10}O$—), 1-ethylcyclobut-1-yl, cyclopropylethenyl, 3-formyl-2-terahydrofuranyl, 2-hexyl-5-tetrahydrofuranyl, hexamethylene-1,6-bis(cyclohex-4-yloxy) (i.e., —$OC_6H_{10}(CH_2)_6C_6H_{10}O$—), 4-hydroxymethylcyclohex-1-yl (i.e., 4-$HOCH_2C_6H_{10}$—), 4-mercaptomethylcyclohex-1-yl (i.e., 4-$HSCH_2C_6H_{10}$—), 4-methylthiocyclohex-1-yl (i.e., 4-$CH_3SC_6H_{10}$—), 4-methoxycyclohex-1-yl, 2-methoxycarbonylcyclohex-1-yloxy (2-$CH_3OCOC_6H_{10}O$—), 4-nitromethylcyclohex-1-yl (i.e., $NO_2CH_2C_6H_{10}$—), 3-trimethylsilylcyclohex-1-yl, 2-t-butyldimethylsilylcyclopent-1-yl, 4-trimethoxysilylethylcyclohex-1-yl (e.g. $(CH_3O)_3SiCH_2CH_2C_6H_{10}$—), 4-vinylcyclohexen-1-yl, vinylidenebis(cyclohexyl), and the like. The term "a $C_3$-$C_{10}$ cycloaliphatic radical" includes cycloaliphatic radicals containing at least three but no more than 10 carbon atoms. The cycloaliphatic radical 2-tetrahydrofuranyl ($C_4H_7O$—) represents a $C_4$ cycloaliphatic radical. The cyclohexylmethyl radical ($C_6H_{11}CH_2$—) represents a $C_7$ cycloaliphatic radical.

As used herein the term "aliphatic radical" refers to an organic radical having a valence of at least one consisting of a linear or branched array of atoms which is not cyclic. Aliphatic radicals are defined to comprise at least one carbon atom. The array of atoms comprising the aliphatic radical may include heteroatoms such as nitrogen, sulfur, silicon, selenium and oxygen or may be composed exclusively of carbon and hydrogen. For convenience, the term "aliphatic radical" is defined herein to encompass, as part of the "linear or branched array of atoms which is not cyclic" organic radicals substituted with a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylpent-1-yl radical is a $C_6$ aliphatic radical comprising a methyl group, the methyl group being a functional group which is an alkyl group. Similarly, the 4-nitrobut-1-yl group is a $C_4$ aliphatic radical comprising a nitro group, the nitro group being a functional group. An aliphatic radical may be a haloalkyl group which comprises one or more halogen atoms which may be the same or different. Halogen atoms include, for example; fluorine, chlorine, bromine, and iodine. Aliphatic radicals comprising one or more halogen atoms include the alkyl halides trifluoromethyl, bromodifluoromethyl, chlorodifluoromethyl, hexafluoroisopropylidene, chloromethyl, difluorovinylidene, trichloromethyl, bromodichloromethyl, bromoethyl, 2-bromotrimethylene (e.g. —$CH_2CHBrCH_2$—), and the like. Further examples of aliphatic radicals include allyl, aminocarbonyl (i.e., —$CONH_2$), carbonyl, 2,2-dicyanoisopropylidene (i.e., —$CH_2C(CN)_2CH_2$—), methyl (i.e., —$CH_3$), methylene (i.e., —$CH_2$—), ethyl, ethylene, formyl (i.e. —CHO), hexyl, hexamethylene, hydroxymethyl (i.e. —$CH_2OH$), mercaptomethyl (i.e., —$CH_2SH$), methylthio (i.e., —$SCH_3$), methylthiomethyl (i.e., —$CH_2SCH_3$), methoxy, methoxycarbonyl (i.e., $CH_3OCO$—), nitromethyl (i.e., —$CH_2NO_2$), thiocarbonyl, trimethylsilyl (i.e. $(CH_3)_3Si$—), t-butyldimethylsilyl, 3-trimethyoxysilylpropyl (i.e., $(CH_3O)_3SiCH_2CH_2CH_2$—), vinyl, vinylidene, and the like. By way of further example, a $C_1$-$C_{10}$ aliphatic radical contains at least one but no more than 10 carbon atoms. A methyl group (i.e., $CH_3$—) is an example of a $C_1$ aliphatic radical. A decyl group (i.e., $CH_3(CH2)_9$—) is an example of a $C_{10}$ aliphatic radical.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

EXAMPLES

General Methods and Procedures

Chemicals were purchased from Aldrich Chemical Company, Milwaukee, Wis., and used as received, unless otherwise noted. Monomers and potassium carbonate were dried and stored in a nitrogen purge box. Toluene was dried over activated molecular sieves. All reactions with air- and/or water-sensitive compounds were carried out under dry nitrogen using standard Schlenk line techniques. NMR spectra were recorded on a Bruker Avance 400 ($^1H$, 400 MHz) spectrometer and referenced versus residual solvent shifts. Molecular weights are reported as number average ($M_n$) or weight average ($M_w$) molecular weight and were determined by gel permeation chromatography (GPC) analysis on a Perkin Elmer Series 200 instrument equipped with UV detector. Polystyrene molecular weight standards were used to construct a broad standard calibration curve against which polymer molecular weights were determined. The temperature of the gel permeation column (Polymer Laboratories PLgel 5 μm MIXED-C, 300×7.5 mm) was 40° C. and the mobile phase was chloroform with isopropanol (3.6% v/v). Polymer thermal analysis was performed on a Perkin Elmer DSC7 equipped with a TAC7/DX thermal analyzer and processed using Pyris Software. Glass transition temperatures were recorded on the second heating scan.

The mixed sulfonation block copolymers of polyetheretherketone-polyethersulfones (SPEEK-SPES) were synthesized by nucleophilic aromatic substitution using the potassium carbonate method in dimethylsulfoxide (DMSO). The overall degree of sulfonation was calculated as follows:

% $SO_3H$=[(mole fraction SPEEK)×100%]+[(mole fraction SPES)×(% $SO_3H$ SPES)]

Kelvin probe (KP) is a vibrating capacitor technique used to measure change in effective surface work functions of conducting/semi-conducting materials by measuring contact potential differences (CPDs in units of volts, V) relative to a common probe, which correspond to changes in effective surface work functions (in units of electron volts, eV). KP measurements were conducted with a digital Kelvin probe KP6500, purchased from McAllister Technical Services, Coeur d'Alene, Id. 83815, USA.

Example 1

Synthesis of 3,3'-Disulfonated 4,4'-difluorodiphenylsulfone

Difluorodiphenylsulfone (75.5 g, 0.297 mol) was transferred into a 500 mL round bottom flask. Fuming sulfuric acid (160 mL) was added. The mixture was stirred under nitrogen at 110° C. for 6 hours. The brown solution was cooled to room temperature and poured into 1 L ice cooled deionized water. NaCl (400 g) was added to salt out the product, which was isolated on a Buchner funnel. The white pasty solid was redissolved in deionized water, neutralized with NaOH solution, then precipitated out with 450 g NaCl. The product was recrystallized from 3:1 isopropanol/water and dried under vacuum at 100° C. Isolated yield: 85 g (62%). $^1$H NMR (DMSO-d$_6$): δ 7.44 (t, 2H), 7.98 (m, 2H), 8.17 (dd, 2H). $^{13}$C NMR (DMSO-d$_6$): δ 118.42 (d, $^2J_{CF}$=25 Hz), 128.32 (d, $^3J_{CF}$=4 Hz), 130.99 (d, $^3J_{CF}$=11 Hz), 136.08 (d, $^4J_{CF}$=4 Hz), 136.61 (d, $^2J_{CF}$=19 Hz), 160.51 (d, $^1J_{CF}$=258 Hz).

Example 2

Synthesis of 3,3'-disulfonated 4,4'-difluorobenzophenone

Difluorobenzophenone (100 g, 0.458 mol) was transferred into a 1 L round bottom flask and 250 mL fuming sulfuric acid (30% SO$_3$) was added. The mixture was stirred under nitrogen at 110° C. for 7 hours. The mixture was cooled to room temperature and poured into 1.5 L of ice water. The insoluble material was filtered off. NaCl was added to the solution to salt out the product. The white pasty solid was isolated on a large Buchner funnel, redissolved in a minimum of deionized water, and neutralized to pH 7 using NaOH. The product was again salted out with NaCl. The white pasty solid was recrystallized from 3:1 isopropanol/water (note: some grayish water insoluble material was filtered off before recrystallizing.) Isolated yield: 71 g (37%). $^1$H NMR (DMSO-d$_6$): δ 7.34 (t, 2H), 7.72 (m, 2H), 8.07 (dd, 2H).

Example 3

Synthesis of Sulfonated Polyetheretherketone-Sulfonated Polyethersulfone Block Copolymers Sulfonated difluorobenzophenone (8 g, 18.9 mmol), 4,4'-biphenol (3.669 g, 19.7 mmol), and potassium carbonate (9.818 g, 71 mmol) were transferred into a three-neck flask connected to a Dean-Stark trap/condenser, nitrogen inlet, and mechanical stirrer. Anhydrous dimethylsulfoxide (DMSO) (48 mL) and toluene (24 mL) were added. The mixture was stirred at 145° C. for 5 hours, and water/toluene was removed by azeotropic distillation. 4,4'-Difluorodiphenylsulfone (5.78 g, 22.7 mmol), 3,3'-disulfonated-4,4'-difluorodiphenylsulfone (2.605 g, 5.68 mmol), 4,4'-(hexafluoroisopropylidene) diphenol (9.298 g, 27.7 mmol), DMSO (12 mL) and toluene (8 mL) were added. The mixture was stirred at 145° C. for 1 hour. The viscous solution was diluted with DMSO (60 mL) and stirred at 145° C. for another hour until the solution became viscous again. The mixture was diluted with DMSO (100 mL) and precipitated into stirring isopropanol. The polymer was isolated, dried under vacuum briefly, and washed/soaked in deionized water until the washings were pH neutral. The polymer was dried under vacuum at 100° C. Polymer films were cast from DMSO and acidified by soaking in 1M sulfuric acid at room temperature for 24 hours. These were further soaked in water for 6 hours, and then dried under vacuum at 100° C. The final product was found to have an Mw and Mn of 75896 and 29863, respectively, as characterized by GPC (in 0.05M DMAc/LiBr, polyethylene oxide and polyethylene glycol standards).

Example 4

Kelvin Probe Measurement

Samples for the KP measurements were prepared as follows. Indium tin oxide (ITO, about 110 nanometer) coated glass obtained from Applied Films Corporation was used as a conductive substrate. The ITO substrate was cleaned with acetone, iso-proponal and de-ionized water and then baked at 150° C. for 5 mins prior to the KP measurements. A CPD of −0.58V was obtained for the ITO. Then a layer of the sulfonated polyarylether described in example 3 was spin-coated from its 2 wt % solution in dimethyl sulfoxide (DMSO) on top of the ITO and then baked at 180° C. for 3 mins. A CPD of −1.24V was measured for the ITO over-coated with the polymer. The change in CPD for ITO with and without the sulfonated polyarylether layer indicates an increase in effective work function of 0.66 eV when the ITO is over-coated with the sulfonated polyarylether.

Example 5

An Exemplary OLED Comprising Sulfonated Polyarylether from Example 3 as a Hole-Injection Layer An Exemplary OLED was made as follows. Glass pre-coated with indium tin oxide (ITO) (Applied Films) was used as the substrate. Then a layer of sulfonated polyarylether was spin-coated from its 0.3 wt % solution in DMSO atop the ITO substrate and further baked for 5 mins at 180° C. in ambient environment (with a room temperature of 24° C. and relative humidity of 32%). Next, a layer (ca. 65 nm) of a green light-emitting polymer (LEP) was then spin-coated atop the sulfonated polyarylether layer. The device fabrication was finished with the deposition of a bilayer cathode consisting of 4 nm NaF and 110 nm Al via thermal evaporation at a base vacuum of 2×10$^{-6}$ Torr. Following metal evaporation, the devices were encapsulated using a glass slide sealed with epoxy.

Example 6

A Control OLED

A control OLED was made in the same way as described in Example 5 except no polymer was used in this device.

Figure 2:
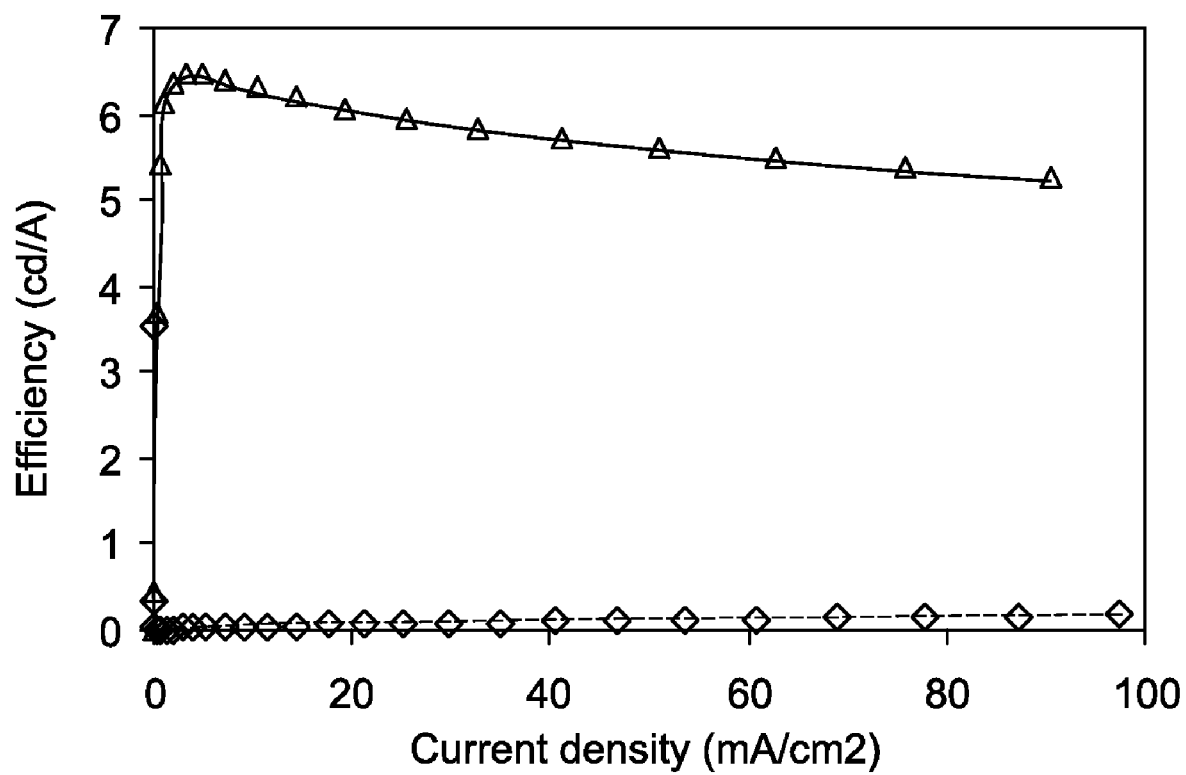
FIG. 2 shows the efficiency versus current density curves for the control OLED (diamonds) and the exemplary OLED (triangles).

Performance of the OLEDs made in Example 5 and Example 6 was characterized by measuring current-voltage-luminance (I-V-L) characteristics. A photodiode calibrated with a luminance meter (Minolta LS-110) was used to measure the luminance (in units of candela per square meter, cd/m2). FIG. 1 shows a plot of brightness (measured in candela per square meter, cd/m2) as a function of bias voltage (measured in volts, V). FIG. 2 shows the efficiency (measured in candela per ampere, cd/A) as a function of current density (measured in milliamperes per square centimeter, mA/cm2).

Clearly it can be seen, introducing the sulfonated polyarylether as a hole-injection layer significantly improves device performance, as evidenced by the fact that the exemplary device comprising the hole-injection layer exhibits lowered driving voltages (FIG. 1) and enhanced efficiency (FIG. 2) relative to the control device.

Figure 3:
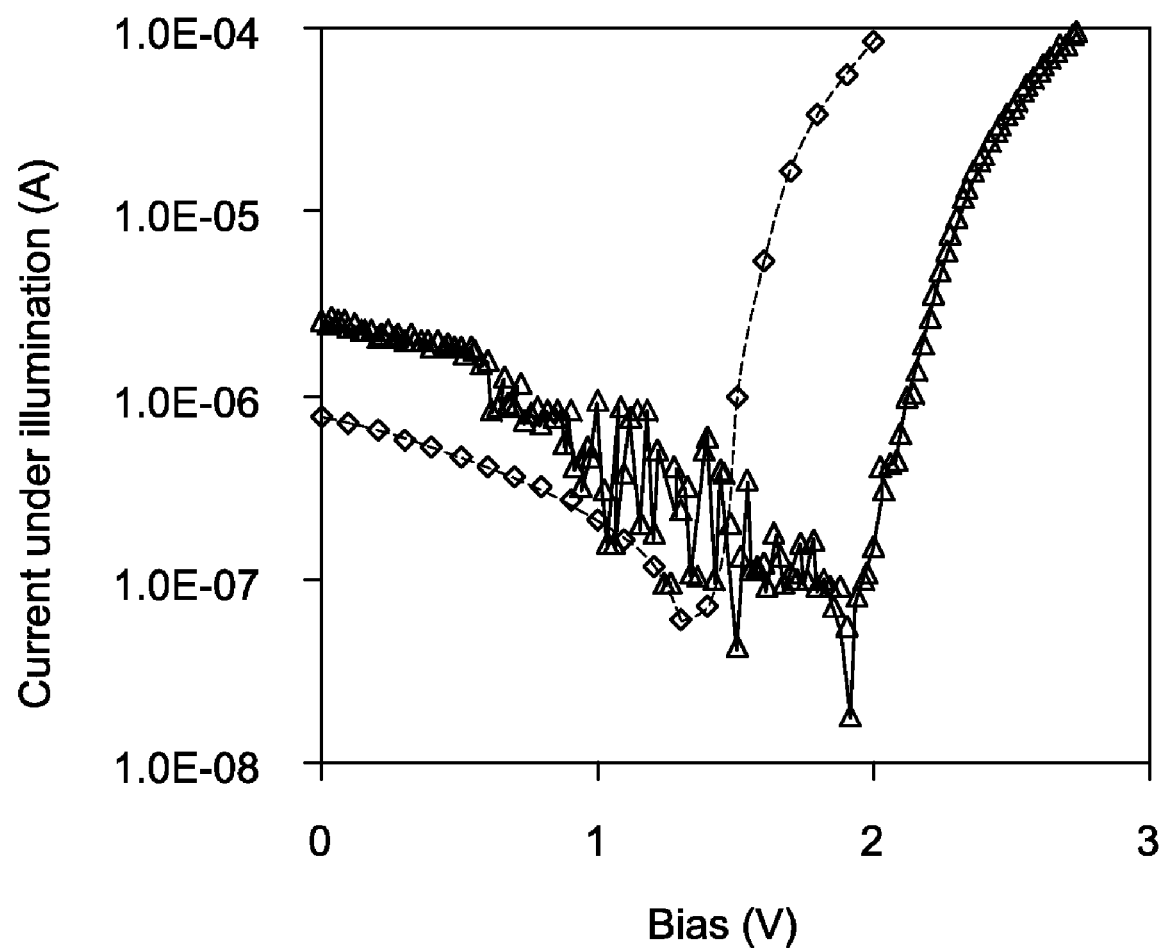
FIG. 3 shows the current-voltage curves of the control OLED (diamonds) and the exemplary OLED (triangles) measured under illumination.

Photo-responses of the OLEDs made in Example 3 and Example 4 were characterized by measuring their current-voltage (IV) characteristics under illumination. In particular, a hand-held long wavelength (365 nm) UV-lamp (model: UVL__56, obtained from UVP, Upland, Calif. 91745, U.S.A.) was used as the illumination light source (with an intensity of ca. 3 mW/cm2). The devices were illuminated through the transparent ITO electrode. FIG. 3 shows the I-V curves of the OLEDs measured under illumination. Clearly it can be seen, the OLED with the sulfonated polyarylether hole-injection layer exhibits a greater open-circuit voltage ($V_{oc}$, defined as the voltage when the corresponding current reaches its minimum in the plot) relative to the control devices without the sulfonated polyarylether layer. The increase in $V_{oc}$ is consistent with the fact that sulfonated polyarylether has a greater effective work function relative to a bare ITO as measured by the KP measurements.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An opto-electronic device comprising at least one organic electroluminescent layer and a layer comprising at least one sulfonated aromatic condensation copolymer sandwiched between a pair of electrodes, wherein the at least one sulfonated aromatic condensation copolymer comprises a sulfonated polyarylether block copolymer comprising at least one sulfonated polyaryletherketone block having structural units of formula I

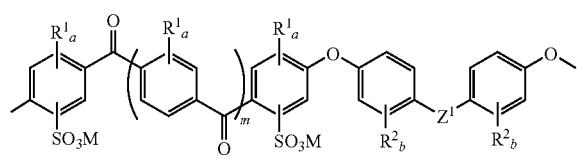

wherein $R^1$ and $R^2$ are independently $C_1$-$C_{10}$ alkyl, $C_3$-$C_{12}$ cycloalkyl, $C_6$-$C_{14}$ aryl, allyl, alkenyl, alkoxy, halo, or cyano;

$Z^1$ is a direct bond, O, S, $CH_2$, SO, $SO_2$, CO, phosphinyl oxide, alkenyl, alkynyl, a $C_1$-$C_{12}$ aliphatic radical, a $C_3$-$C_{12}$ cycloaliphatic radical, a $C_3$-$C_{12}$ aromatic radical or a combination thereof;

M is H, a metal cation, a non-metallic inorganic cation, an organic cation or a mixture thereof;

a is 0 or an integer from 1 to 3;

b is 0 or an integer from 1 to 4;

m is 0 or 1.

2. The opto-electronic device according to claim 1, wherein M is H and $Z^1$ is a direct bond.

3. An opto-electronic device comprising at least one organic electroluminescent layer and a layer comprising at least one sulfonated aromatic condensation copolymer sandwiched between a pair of electrodes, wherein the at least one sulfonated aromatic condensation copolymer comprises a sulfonated polyarylether block copolymer additionally comprising at least one unsulfonated polyarylethersulfone block having structural units of formula II

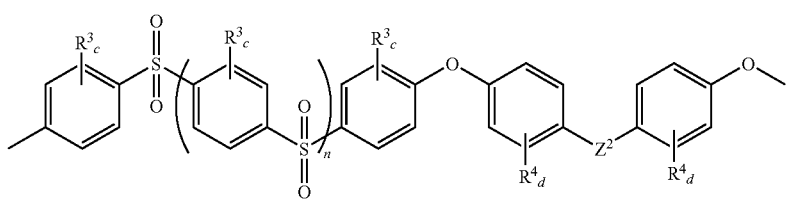

wherein $R^3$ and $R^4$ are independently $C_{11}$-$C_{10}$ alkyl, $C_{3\text{-}12}$ cycloalkyl, $C_{6\text{-}14}$ aryl, allyl, alkenyl, alkoxy, halo, or cyano;

$Z^2$ is a direct bond, O, S, $CH_2$, SO, $SO_2$, CO, phospinyl oxide, alkenyl, alkynyl, a $C_1$-$C_{12}$ aliphatic radical, a $C_3$-$C_{12}$ cycloaliphatic radical, a $C_3$-$C_{12}$ aromatic radical or a combination thereof;

M is H, a metal cation, a non-metallic inorganic cation, an organic cation or a mixture thereof;

c is 0 or an integer from 1 to 3;

d is 0 or an integer from 1 to 4;

n is 0 or 1.

4. The opto-electronic device according to claim 3, wherein $Z^2$ is $C(CF_3)_2$.

5. An opto-electronic device comprising at least one organic electroluminescent layer and a layer comprising at least one sulfonated aromatic condensation copolymer sandwiched between a pair of electrodes, wherein the at least one sulfonated aromatic condensation copolymer comprises a sulfonated polyarylether block copolymer additionally comprising at least one sulfonated polyethersulfone block having structural units of formula III

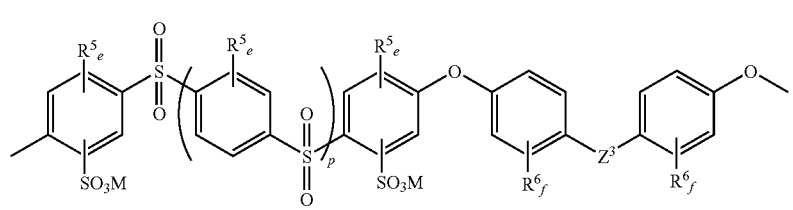

III wherein
R⁵ is $C_1$-$C_{10}$ alkyl, $C_3$-$C_{12}$ cycloalkyl, $C_6$-$C_{14}$ aryl, allyl, alkenyl, alkoxy, halo, or cyano;

Z³ is a direct bond, O, S, $CH_2$, SO, $SO_2$, CO, phospinyl oxide, alkenyl, alkynyl, a $C_1$-$C_{12}$ aliphatic radical, a $C_3$-$C_{12}$ cycloaliphatic radical, a $C_3$-$C_{12}$ aromatic radical or a combination thereof;

M is H, a metal cation, a non-metallic inorganic cation, an organic cation or a mixture thereof;

e is 0 or an integer from 1 to 3;

f is 0 or an integer from 1 to 4; and p is 0 or 1.

6. The opto-electronic device according to claim 5, wherein M is H and Z³ is $C(CF_3)_2$.

7. The opto-electronic device according to claim 5, wherein the sulfonated polyethersulfone comprises at least one sulfonated polyarylethersulfone block having structural units of formula IIIA

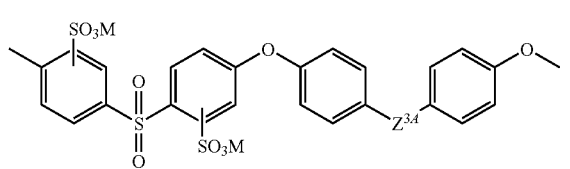

IIIA wherein $Z^{3A}$ is a direct bond, $C(CF_3)_2$ or a combination thereof.

8. The opto-electronic device according to claim 1, wherein the sulfonated polyarylketone comprises structural units of formula IA

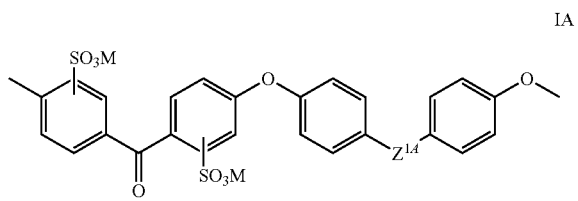

IA wherein $Z^{1A}$ is a direct bond, $C(CF_3)_2$ or a combination thereof.

9. The opto-electronic device according to claim 1, comprising from about 5 mol % to about 50 mol % sulfonated polyetherketone blocks having structural units of formula I.

10. The opto-electronic device according to claim 1, comprising from about 25 mol % to about 50 mol % sulfonated polyetherketone blocks having structural units of formula I.

11. The opto-electronic device according to claim 5, comprising from about 10 mol % to about 70 mol % sulfonated polyethersulfone blocks having structural units of formula III.

12. The opto-electronic device according to claim 5, comprising from about 10 mol % to about 35 mol % sulfonated polyethersulfone blocks having structural units of formula III.

13. The opto-electronic device according to claim 3, comprising about 10 mol % to about 50 mol % unsulfonated polyarylketone blocks having structural units of formula II.

14. The opto-electronic device according to claims 1, 3, or 5, wherein the at least one sulfonated aromatic condensation copolymer comprises at least about 30 mol % sulfonation.

15. The opto-electronic device according to claims 1, 3, or 5, wherein the at least one sulfonated aromatic condensation copolymer comprises at least about 50 mol % sulfonation.

16. The opto-electronic device according to claims 1, 3, or 5, wherein the at least one sulfonated aromatic condensation copolymer comprises from about 20 mol % to about 80 mol % sulfonation.

17. The opto-electronic device according to claims 1, 3, or 5, wherein the at least one sulfonated aromatic condensation copolymer comprises from about 40 mol % to about 80 mol % sulfonation.

18. The opto-electronic device according to claims 1, 3, or 5, wherein the at least one sulfonated aromatic condensation copolymer comprises from about 50 mol % to about 70 mol % sulfonation.

19. The opto-electronic device according to claims 1, 3, or 5, comprising a blend of the at least one sulfonated aromatic condensation copolymer and PEDOT.

20. The opto-electronic device according to claims 1, 3, or 5, wherein the at least one sulfonated aromatic condensation copolymer forms a hole injection layer or a hole collection layer.

* * * * *

UNITED STATES PATENT AND TRADEMARK OFFICE
CERTIFICATE OF CORRECTION

PATENT NO. : 7,740,942 B2  Page 1 of 1
APPLICATION NO. : 11/610076
DATED : June 22, 2010
INVENTOR(S) : Ye et al.

It is certified that error appears in the above-identified patent and that said Letters Patent is hereby corrected as shown below:

In Column 13, Line 6, delete "$H_2C_6H_{10}-$)," and insert -- $H_2NC_6H_{10}-$), --, therefor.

In Column 18, Line 40, in Claim 3, delete "$C_{11}-C_{10}$" and insert -- $C_1-C_{10}$ --, therefor.

Signed and Sealed this

Twenty-third Day of November, 2010

David J. Kappos
*Director of the United States Patent and Trademark Office*